US011024542B2

(12) United States Patent
Lan

(10) Patent No.: US 11,024,542 B2
(45) Date of Patent: Jun. 1, 2021

(54) MANUFACTURING METHOD OF DEVICE CHIP

(71) Applicant: DISCO CORPORATION, Tokyo (JP)

(72) Inventor: Heidi Lan, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 76 days.

(21) Appl. No.: 16/704,334

(22) Filed: Dec. 5, 2019

(65) Prior Publication Data

US 2020/0185275 A1 Jun. 11, 2020

(30) Foreign Application Priority Data

Dec. 6, 2018 (JP) ............................ JP2018-229006

(51) Int. Cl.

| | |
|---|---|
| ***H01L 21/78*** | (2006.01) |
| ***H01L 23/00*** | (2006.01) |
| *H01L 21/268* | (2006.01) |
| *H01L 21/3065* | (2006.01) |
| *H01L 21/304* | (2006.01) |

(52) U.S. Cl.

CPC .............. *H01L 21/78* (2013.01); *H01L 24/27* (2013.01); *H01L 21/268* (2013.01); *H01L 21/304* (2013.01); *H01L 21/3065* (2013.01); *H01L 24/29* (2013.01); *H01L 2224/27009* (2013.01); *H01L 2224/27416* (2013.01); *H01L 2224/27848* (2013.01)

(58) Field of Classification Search

CPC ........... H01L 21/0209; H01L 21/02301; H01L 21/02661; H01L 21/02052; H01L 21/02101; H01L 2221/68304; H01L 2221/68327; H01L 2221/6834; H01L 2221/68354; H01L 21/683; H01L 21/6835; H01L 21/6836; H01L 21/78; H01L 21/3065

See application file for complete search history.

(56) References Cited

U.S. PATENT DOCUMENTS

2012/0322238 A1* 12/2012 Lei ...................... H01L 21/3081 438/462
2014/0141596 A1* 5/2014 Matsuzaki ............. B23K 26/40 438/462
2014/0179084 A1* 6/2014 Lei ........................ H01L 21/822 438/463
2019/0295894 A1* 9/2019 Okita ...................... H01L 21/78

FOREIGN PATENT DOCUMENTS

JP 2010205811 A 9/2010
WO 03071591 A1 8/2003

* cited by examiner

*Primary Examiner* — Scott B Geyer
(74) *Attorney, Agent, or Firm* — Greer Burns & Crain Ltd.

(57) ABSTRACT

A manufacturing method of a device chip includes a die bonding resin providing step of supplying a die bonding resin in a liquid state to a back surface side of a wafer with device chips formed on a front surface thereof and solidifying the die bonding resin, a water-soluble resin providing step of covering the die bonding resin with a water-soluble resin, a laser processing step of applying a laser beam from the back surface side of the wafer to remove the die bonding resin and the water-soluble resin, an etching step of etching an exposed portion on the back surface side of the wafer to divide the wafer, and a water-soluble resin removing step of supplying water on the back surface side of the wafer to remove the water-soluble resin.

2 Claims, 6 Drawing Sheets

14 18a 16a 9 13 15 20a 1b 1 7 16a 16 1a 24 28 26a 9 30 13 30 1b 1 7 26a 1c 26 1a

MANUFACTURING METHOD OF DEVICE CHIP

BACKGROUND OF THE INVENTION

Field of the Invention

The present invention relates to a manufacturing method of a device chip by dividing a wafer into individual device chips on which a die bonding resin serving as a die attach film (DAF) is provided.

Description of the Related Art

Device chips individually mounted with a plurality of devices are formed by dividing a wafer for each device, the wafer having the plurality of devices are formed in separated respective regions defined by a plurality of division lines on the front side thereof. In recent years, a tendency of reducing in size and thickness of electric equipment on which a device chip is mounted has been remarkable, and such demand for thinning a device chip has been increased. In view of this, a thin-type device chips are manufactured in such a way that a wafer is ground on a back surface side of the wafer before dividing the wafer to be thinned and the wafer thus thinned is divided into individual device chips. As a method of dividing a wafer, there have been known a method of cutting in the wafer along a division line with a cutting blade having a cutting edge in a ring shape while rotating the cutting blade, and a method of laser-processing a wafer by applying a laser beam along a division line on the wafer. Device chips formed through these methods are mounted on a predetermined mounting object to be used.

In the case of dividing a wafer through these processing methods, there is a possibility that a chipping, a strain in a crystal of the wafer, or the like may occur at a cut section or an end of a device chip formed. Occurrence of such a chipping or a strain in the crystal of the wafer in the device chip causes reduction in bending strength of the device chip. In order to suppress the reduction in bending strength of the device chip, a technique has been developed in which a plurality of grooves along respective division lines are formed in a wafer and the wafer is then thinned by grinding to be divided into individual device chips. Further, in order to enhance the bending strength of the device chip, a technique of dividing a wafer by plasma etching has been developed (for example, see Japanese Patent No. 4447325). In this technique, a resist film is formed on a front surface or a back surface of a wafer, the resist film is then partially removed (patterned) to cause the wafer to be exposed along division lines, and an etchant gas is converted into plasma to react with an exposed portion of the wafer. After that, the resist film is entirely removed. In this case, formation, patterning, and removal of the resist film has required high cost.

Meanwhile, in order to achieve a small mounting area in a device chip and high integration thereof, there has been developed a technique in which a plurality of device chips are stacked on top of another and the stacked device chips are packaged. In this technique, an adhesive film called a DAF is provided in advance on each device chip, and the device chips are attached to each other through the DAF to enable formation of a package. Note that the DAF is useful also in the case of mounting a single-layer device chip onto a predetermined mounting object. The device chip with the DAF can be obtained by attaching a DAF to a wafer and then dividing the DAF along with the wafer. However, since the thinned wafer is degraded in strength, when a roller or the like is used in attaching the DAF to the wafer and the DAF is pressed to the wafer with the roller, a damage may occur in a device chip. In addition, in a case in which the DAF is cut along with the wafer with a cutting blade, large burrs may be generated in the DAF. In order to prevent these problems, there has been developed such a technique that a die bonding resin in a liquid state is coated on a wafer by spin coating, the coated die bonding resin is solidified, and the wafer is then divided along with the solidified die bonding resin (see Japanese Patent No. 5384972). The die bonding resin thus solidified functions as the DAF.

SUMMARY OF THE INVENTION

After the die bonding resin in a liquid state is coated on the wafer and then solidified, division of the wafer is enabled by plasma etching, so that the device chips with the die bonding resin provided thereon can be efficiently manufactured. For example, when the die bonding resin provided on the wafer is patterned to be used as a resist film, there is no need to additionally prepare another resist film. In addition, since the die bonding resin is used as the DAF, the die bonding resin which has been used as the resist film is not required to be removed. However, when the wafer on which the die bonding resin is provided is loaded into a processing chamber of a plasma etching apparatus and an etchant gas is converted into plasma in the processing chamber which has been evacuated to be in a vacuum state to cause the plasma to react with the wafer, the die bonding resin is degraded. The degraded die bonding resin impairs a bonding capability as the DAF, thereby causing generation of a bonding defect due to failure of a proper attachment when the device chip formed is attached to a predetermined object.

It is therefore an object of the present invention to provide a manufacturing method of a device chip in which degradation of a die bonding resin provided on a wafer is suppressed when device chips are formed by dividing the wafer by plasma etching.

In accordance with an aspect of the present invention, there is provided a manufacturing method of a device chip, including: a protective member providing step of providing a protective member on a front surface side of a wafer on which a plurality of devices are individually formed in separate respective regions defined by a plurality of division lines crossing each other on the front surface side of the wafer; a die bonding resin providing step of supplying a die bonding resin in a liquid state to a back surface side of the wafer and solidifying the die bonding resin, after the protective member providing step is carried out; a water-soluble resin providing step of supplying a water-soluble resin in a liquid state to a front surface of the die bonding resin solidified to cover the die bonding resin with the water-soluble resin, after the die bonding resin providing step is carried out; a laser processing step of applying a laser beam having an absorption wavelength to the wafer from the back surface side of the wafer and removing the die bonding resin and the water-soluble resin along each of the division lines to thereby partially expose the back surface of the wafer along the each of the division lines, after the water-soluble resin providing step is carried out; an etching step of supplying an etching gas in a plasma state to the back surface side of the wafer and etching an exposed portion of the wafer on the back surface side thereof while protecting the die bonding resin with the water-soluble resin to thereby divide the wafer into individual device chips, after the laser processing step is carried out; and a water-soluble resin removing step of supplying water to the back surface side of the wafer and removing the water-soluble resin to obtain device chips with the die bonding resin provided thereon, after the etching step is carried out.

Preferably, the manufacturing method of a device chip according to the aspect of the present invention further includes a grinding step of grinding the back surface of the wafer to thin the wafer to a predetermined thickness of each of the device chips, before the die bonding resin providing step.

In the manufacturing method of a device chip according to the aspect of the present invention, the die bonding resin formed on the back surface of the wafer is covered with the water-soluble resin before carrying out the etching step. Then, after the back surface of the wafer is partially exposed by laser processing with application of the laser beam along the division lines, the exposed portion of the back surface of the wafer is subjected to plasma etching to divide the wafer. In this case, when the plasma etching is carried out, the die bonding resin and the water-soluble resin function as a resist film together to thereby protect other portions of the wafer than the division lines, and at the same time, the water-soluble resin protects the die bonding resin. As a result, degradation of the die bonding resin is prevented. After that, the wafer is cleaned with water to remove the water-soluble resin, and accordingly, device chips with the die bonding resin provided on the back surface thereof are obtained.

Thus, according to the present invention, there is provided the manufacturing method of a device chip in which degradation of the die bonding resin provided on the wafer is suppressed when the device chips are formed by dividing the wafer by plasma etching.

The above and other objects, features and advantages of the present invention and the manner of realizing them will become more apparent, and the invention itself will best be understood from a study of the following description and appended claims with reference to the attached drawings showing a preferred embodiment of the invention.

BRIEF DESCRIPTION OF THE DRAWINGS

FIG. 50 is an enlarged cross-sectional view schematically illustrating the wafer which has been divided after carrying out an etching step according to the preferred embodiment of the present invention.

DETAILED DESCRIPTION OF THE PREFERRED EMBODIMENT

Figure 1A:
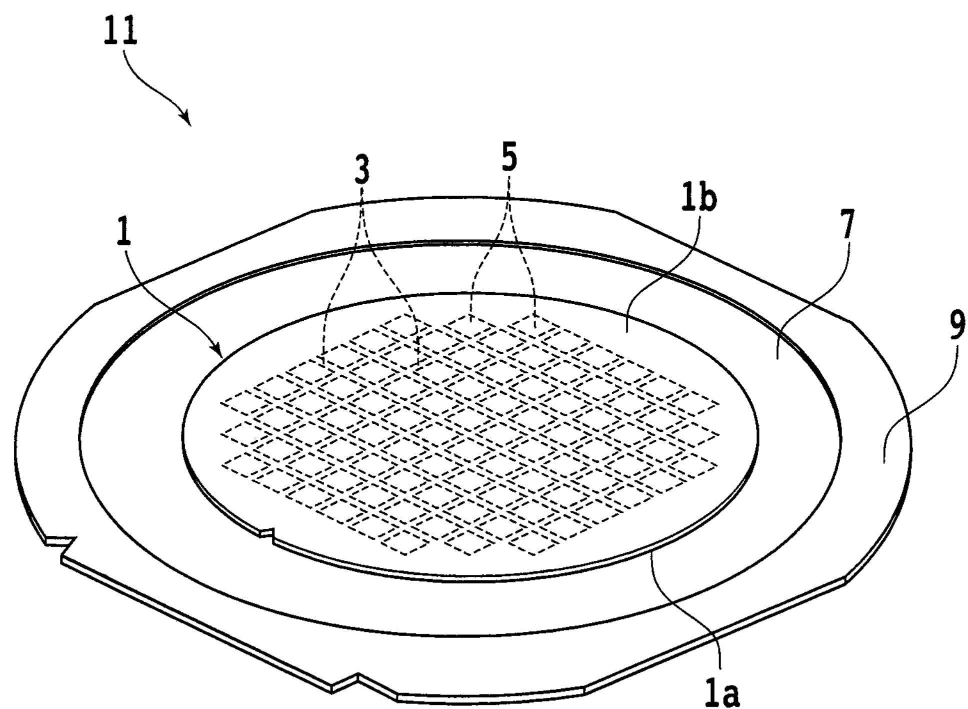
FIG. 1A is a perspective view illustrating a frame unit including a wafer to be processed in a manufacturing method of a device chip according to a preferred embodiment of the present invention.

A description will be given below regarding a preferred embodiment of the present invention with reference to the attached drawings. In a manufacturing method of a device chip according to the preferred embodiment of the present invention, a wafer formed with a plurality of devices on a front surface thereof is divided by plasma etching to manufacture individual device chips. FIG. 1A is a perspective view schematically illustrating a frame unit 11 including a wafer 1 to be processed in the manufacturing method of a device chip according to the preferred embodiment of the present invention. First, the wafer 1 as a workpiece will be described. The wafer 1 has a front surface 1*a* and a back surface 1*b*. Note that FIG. 1A illustrates a state in which the back surface 1*b* of the wafer 1 faces upward. In FIG. 1A, structural objects and the like which are formed on the front surface 1*a* and cannot be visually recognized from the back surface 1*b* side of the wafer 1 are indicated with a chain line.

The wafer 1 is a substantially disc-shaped substrate or the like which is composed of a semiconductor material such as silicon (Si), silicon carbide (SiC), gallium nitride (GaN), gallium arsenide (GaAs), or the like, or a material such as sapphire, glass, or quartz, for example. Examples of the glass include alkaline glass, nonalkaline glass, soda lime glass, lead glass, borosilicate glass, and silica glass. The front surface 1*a* of the wafer 1 is demarcated in a grid pattern by a plurality of division lines 3 crossing each other to define separate respective regions where a plurality of devices 5 such as integrated circuits (ICs), large-scale integrated circuits (LSIs), and light emitting diodes (LEDs) are formed. According to the manufacturing method of a device chip according to the preferred embodiment, the wafer 1 is divided along the plurality of division lines 3 by plasma etching to thereby form individual device chips mounted with the respective devices 5.

Next, each step in the manufacturing method of a device chip according to the preferred embodiment will be described. In the manufacturing method, first, a protective member providing step S1 of providing a protective member on the front surface 1*a* side of the wafer 1 is carried out. FIG. 1A illustrates the wafer 1 on which a protective member 7 is provided on the front surface 1*a* side. The protective member 7 is an adhesive tape having a diameter larger than a diameter of the wafer 1, for example, and an adhesive surface of the protective member 7 is attached to the front surface 1*a* of the wafer 1. A base material of the protective member 7 is not particularly limited as long as it has a resistant to a plasma etching process and a cleaning process by use of a cleaning liquid including water, which will be described later.

On an outer peripheral portion of the protective member 7, a ring frame 9 formed of a metal or the like may be attached. In this case, first, the frame 9 and the wafer 1 are placed on a predetermined table surface such that the wafer 1 with the front surface 1*a* facing upward is positioned at a center of an inside opening of the frame 9. Then, the protective member 7 is attached to the frame 9 and the wafer 1 so as to cover upper portions of the frame 9 and the wafer 1. In this manner, the wafer 1, the protective member 7, and the frame 9 are united to form a frame unit 11. After the frame unit 11 is formed, handling of the wafer 1 becomes easy since the wafer 1 can be handled through the protective member 7 and the frame 9 in the later steps. In addition, the individual device chips formed by dividing the wafer 1 are supported by the frame 9 through the protective member 7, so that handling of each device chip is also easy.

Figure 1B:
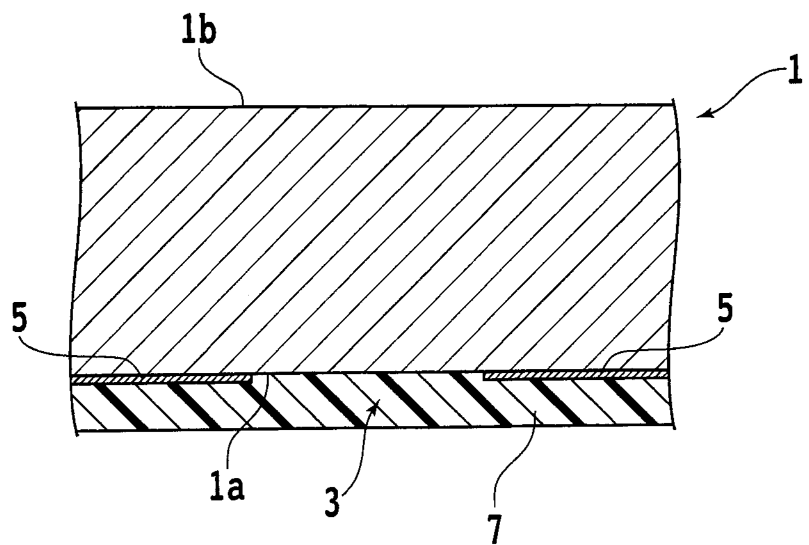
FIG. 1B is an enlarged cross-sectional view schematically illustrating the wafer of FIG. 1A.

FIG. 1B is an enlarged cross-sectional view schematically illustrating the wafer 1 with the protective member 7 provided on the front surface 1*a* thereof after the protective member providing step S1 is carried out. As illustrated in FIGS. 1A and 1B, when the protective member providing step S1 is carried out, the front surface 1*a* side of the wafer 1 can be protected by the protective member 7, and the back surface 1*b* side of the wafer 1 is exposed upward. Note that, in the sectional views such as FIG. 1B schematically illustrating the wafer 1 in an enlarged manner, the structural objects formed in regions overlapping with the division lines 3 on the front surface 1*a* side of the wafer 1 are omitted. For example, an interlayer insulating film or a wiring layer to be used in each device 5 may be formed between any adjacent ones of the devices 5 on the front surface 1*a* side of the wafer 1, or test element groups (TEGs) may be formed therebetween. When the wafer 1 is divided, these structural objects are removed along with the wafer 1.

Figure 2:
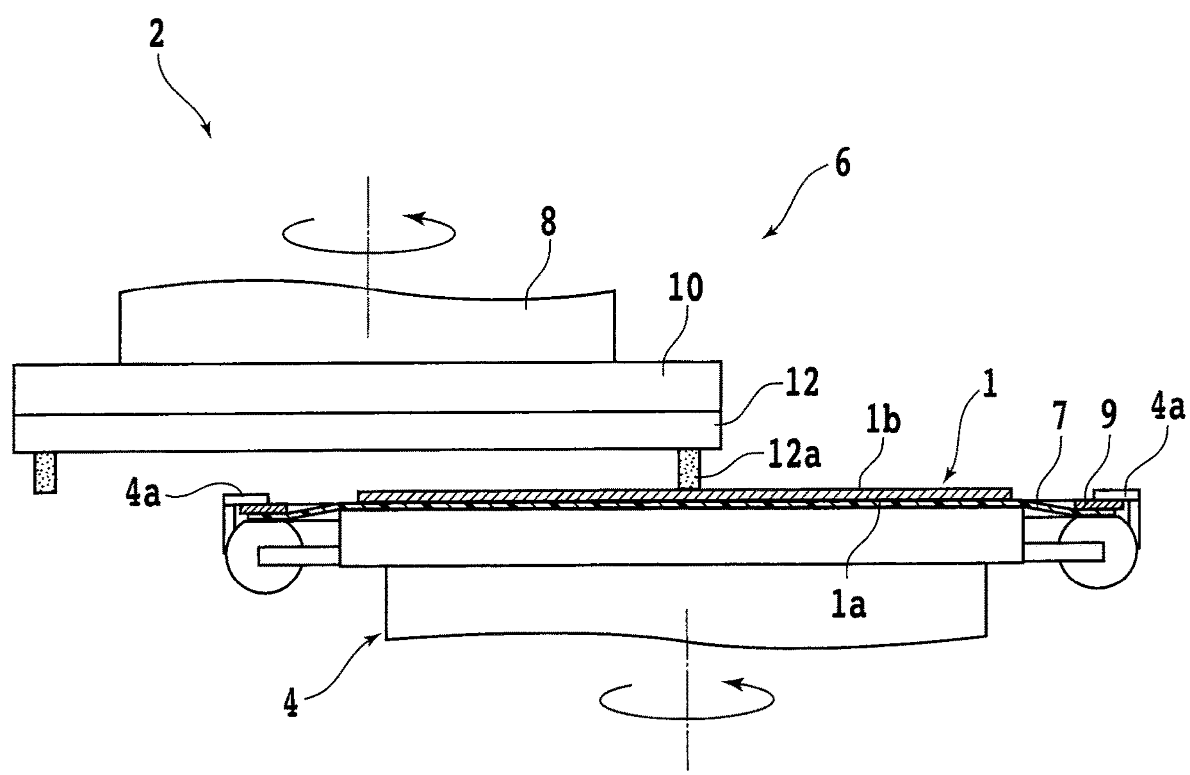
FIG. 2 is a cross-sectional view schematically illustrating a manner of a grinding step according to the preferred embodiment of the present invention.

In the manufacturing method of a device chip according to the preferred embodiment, a grinding step S2 of grinding the back surface 1*b* of the wafer 1 to thin the wafer 1 to a predetermined thickness may be carried out before providing a die bonding resin to the back surface 1*b* of the wafer 1. FIG. 2 is a cross-sectional view schematically illustrating a manner of the grinding step S2. In FIG. 2, cross sections of the wafer 1 and the like when the grinding step S2 is carried out are illustrated.

A grinding apparatus 2 which carries out the grinding step S2 will be described. The grinding apparatus 2 includes a holding table 4 holding the wafer 1 as a workpiece, and a grinding unit 6 grinding the wafer 1 held on the holding table 4. The holding table 4 includes a porous member on its upper surface (holding surface), and a suction path connected to the porous member at one end thereof is provided inside the holding table 4. A suction source is connected with the other end of the suction path. At an outer periphery of the upper surface of the holding table 4, a plurality of clamps 4*a* gripping the frame 9 are provided. When the wafer 1 is ground, the front surface 1*a* side of the wafer 1 is oriented downward, the wafer 1 is placed on the upper surface of the holding table 4 with the protective member 7 interposed therebetween, and the frame 9 is clamped with the plurality of clamps 4*a*. Then, the suction source is operated to generate a negative pressure, and the generated negative pressure passes through the suction path and the porous member so as to be applied to the wafer 1 held on the upper surface of the holding table 4. Accordingly, the wafer 1 is held under suction on the upper surface of the holding table 4. In other words, the upper surface of the holding table 4 serves as a suction surface. Note that the holding table 4 is rotatable about an axis extending in a direction perpendicular to the holding surface thereof.

The grinding unit 6 provided above the holding table 4 includes a spindle 8 extending in the direction perpendicular to the holding surface of the holding table 4, and a wheel mount 10 provided at a lower end of the spindle 8. The spindle 8 has a rotational drive source such as a motor connected thereto. The rotational drive source rotates the spindle 8 about the axis extending in the direction perpendicular to the holding surface. A grinding wheel 12 is fixed to a lower surface of the wheel mount 10. A plurality of grinding stones 12*a* are mounted in a circular arrangement on a lower surface of an outer peripheral portion of the grinding wheel 12. The grinding stones 12*a* has small abrasive grains such as diamond, and a bonding material holding the abrasive grains in a dispersed state. When the spindle 8 rotates, the grinding wheel 12 rotates simultaneously, so that the grinding stones 12*a* move along a rotational trajectory. In the grinding apparatus 2, a relative positional relation between the grinding unit 6 and the holding table 4 in a horizontal direction is adjusted such that the rotational trajectory includes a position above a center of the holding surface of the holding table 4.

In the grinding step S2, the wafer 1 is held under suction on the holding table 4 with the back surface 1*b* side of the wafer 1 exposed upward. Then, the holding table 4 and the spindle 8 are rotated, and the grinding unit 6 is lowered. When each lower surface of the grinding stones 12*a* moving along the rotational trajectory comes in contact with the back surface 1*b* of the wafer 1, the wafer 1 is ground to be thinned. Then, the grinding unit 6 is lowered until the wafer 1 becomes a predetermined finished thickness. In this case, the predetermined finished thickness is a finished thickness of the device chips formed by dividing the wafer 1, for example.

Note that the grinding step S2 may be carried out before the protective member providing step S1. In this case, a protective tape having a diameter substantially same as the diameter of the wafer 1 is attached to the front surface 1*a* side of the wafer 1 in advance, and the grinding step S2 is carried out protecting the front surface 1*a* side of the wafer 1 with the protective tape. After that, the protective tape is separated from the wafer 1, the protective member providing step S1 is carried out to unite the wafer 1, the protective member 7, and the frame 9 to form the frame unit 11, and the front surface 1*a* side of the wafer 1 is protected with the protective member 7. Note that, when the wafer 1 is thinned by the grinding step S2, the wafer 1 reduces its strength. Accordingly, when the protective tape is separated from the front surface 1*a* of the wafer 1, a tape-like support member may be attached to the back surface 1*b* side of the wafer 1. In this case, after the protective member providing step S1 is carried out after attaching the support member to the back surface 1*b* side of the wafer 1, the support member may be separated from the back surface 1*b* of the wafer 1.

Figure 3A:
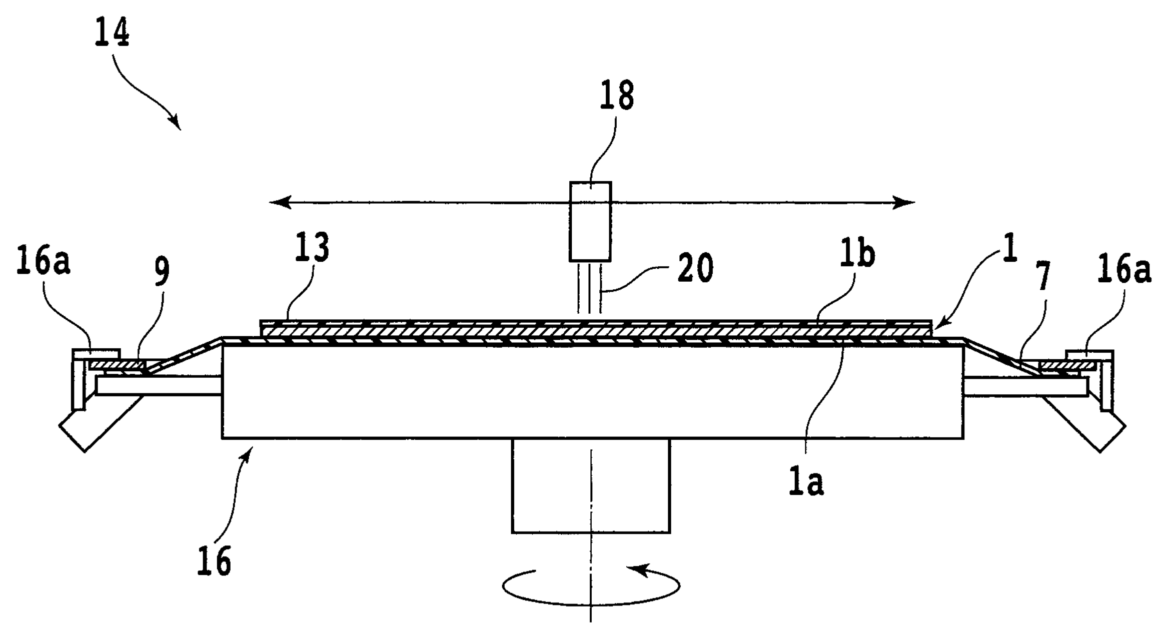
FIG. 3A is a cross-sectional view schematically illustrating a manner of a die bonding resin providing step according to the preferred embodiment of the present invention.

In the manufacturing method of a device chip according to the preferred embodiment, next, carried out is a die bonding resin providing step S3 in which a die bonding resin in a liquid state is supplied to the back surface 1*b* side of the wafer 1 and the die bonding resin is solidified. FIG. 3A is a cross-sectional view schematically illustrating a manner of the die bonding resin providing step S3. FIG. 3A illustrates cross-sections of the wafer 1 and the like. In the die bonding resin providing step S3, a coating apparatus 14 illustrated in FIG. 3A is used, for example. The coating apparatus 14 includes a holding table 16 holding the wafer 1, a discharging nozzle 18 discharging a die bonding liquid resin 20 onto the wafer 1 held on the holding table 16. A plurality of clamps 16*a* are provided on an outer peripheral portion of an upper surface of the holding table 16, the clamps 16*a* gripping the frame 9 of the frame unit 11 including the wafer 1. The discharging nozzle 18 has a discharging port facing downward, not illustrated, and can move along a trajectory passing through a position above a center of the upper surface of the holding table 16, discharging the die bonding liquid resin 20 from the discharging port.

In the die bonding resin providing step S3, first, the wafer 1 is placed on the holding table 16 through the protective member 7 in a state in which the front surface 1*a* side of the wafer 1 faces downward. Then, the holding table 16 is rotated about the axis extending the direction perpendicular to the upper surface thereof at high speed. Further, while the die bonding liquid resin 20 is dropped on the back surface 1*b* of the wafer 1 at a predetermined drop speed from the discharging nozzle 18, the discharging nozzle 18 is horizontally moved back and forth along a path passing through a position above a center of the back surface 1*b* of the wafer 1. A thickness of a die bonding resin 13 provided on the back surface 1*b* side of the wafer 1 can be adjusted by an amount of the die bonding liquid resin 20 which is dropped from the discharging nozzle 18 and a rotational speed of the holding table 16. Also, the die bonding resin 13 may be supplied to the back surface 1*b* of the wafer 1 by screen printing, and may be provided on the back surface 1*b* of the wafer 1 being planarized by a centrifugal force.

Figure 3B:
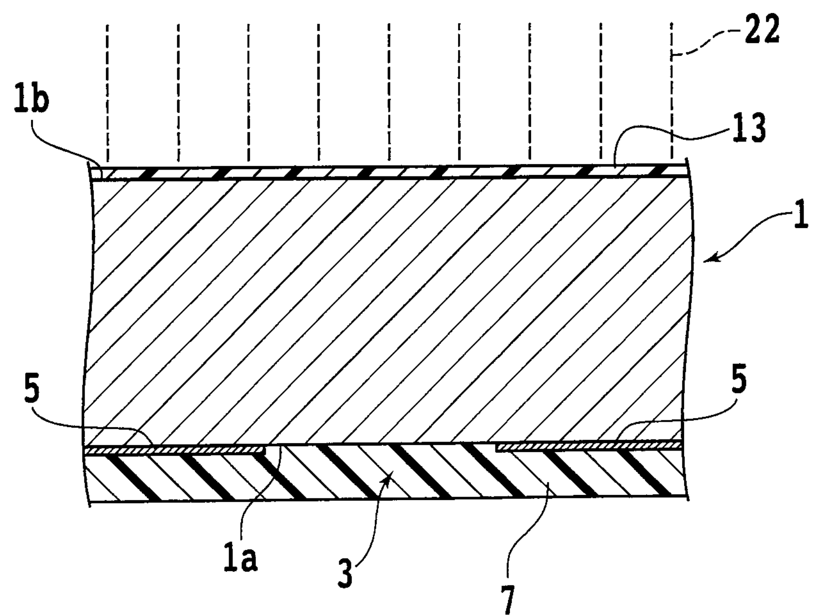
FIG. 3B is an enlarged cross-sectional view schematically illustrating the wafer on which a die bonding resin is provided.

Next, the die bonding resin 13 in a liquid state which has been supplied on the back surface 1*b* side of the wafer 1 is solidified. FIG. 3B is an enlarged cross-sectional view schematically illustrating a manner of solidifying the die bonding resin 13 in a liquid state which is supplied to the back surface 1*b* side of the wafer 1. For example, if the die bonding resin 13 is a material to be solidified by irradiation of an ultraviolet ray, solidification of the die bonding resin 13 can be carried out by applying an ultraviolet ray 22 to the die bonding resin 13. Alternatively, by heating the die bonding resin 13, the die bonding resin 13 may be solidified.

Note that the solidification of the die bonding resin 13 may be carried out by transferring the wafer 1 to an ultraviolet irradiation apparatus including an ultraviolet irradiation unit capable of applying the ultraviolet ray 22 to the die bonding resin 13. Alternatively, the wafer 1 may be transferred to a heating apparatus including a heating unit having a heat source and capable of heating the wafer 1. Alternatively, the coating apparatus 14 may include the ultraviolet irradiation unit or the heating unit, and in this case, solidification of the die bonding resin 13 is carried out on the holding table 16 of the coating apparatus 14. Also, the die bonding resin 13 may be configured by a plurality of die bonding resin layers stacked on top of another. In this case, the first die bonding resin layer is coated on the back surface 1*b* of the wafer 1 and solidified, after which the second die bonding resin layer is coated on the back surface 1*b* of the wafer and then solidified. In this manner, by stacking die bonding resin layers on the back surface 1*b* side of the wafer 1 one after another, the die bonding resin 13 having a predetermined thickness is formed on the back surface 1*b* side of the wafer 1.

In a case in which the DAF is attached to the back surface 1*b* side of the wafer 1 without using the manufacturing method of a device chip according to the preferred embodiment of the present invention, there is a possibility that the wafer 1 may be broken when the DAF is pressed down to the wafer 1 by using a roller or the like. In particular, the wafer 1 which has been thinned in the grinding step S2 reduces its strength, and accordingly, the wafer 1 is liable to be broken. In contrast, in a case in which the die bonding resin 13 in a liquid state is supplied to the back surface 1*b* side of the wafer 1 and then solidified according to the preferred embodiment of the present invention, a load on the wafer 1 becomes relatively small, whereby the wafer 1 is not likely to be damaged. Thus, according to the manufacturing method of a device chip of the preferred embodiment, it is possible to provide the die bonding resin 13 capable of functioning as the DAF on the back surface 1*b* of the wafer 1 without generating damage on the wafer 1.

Figure 4A:
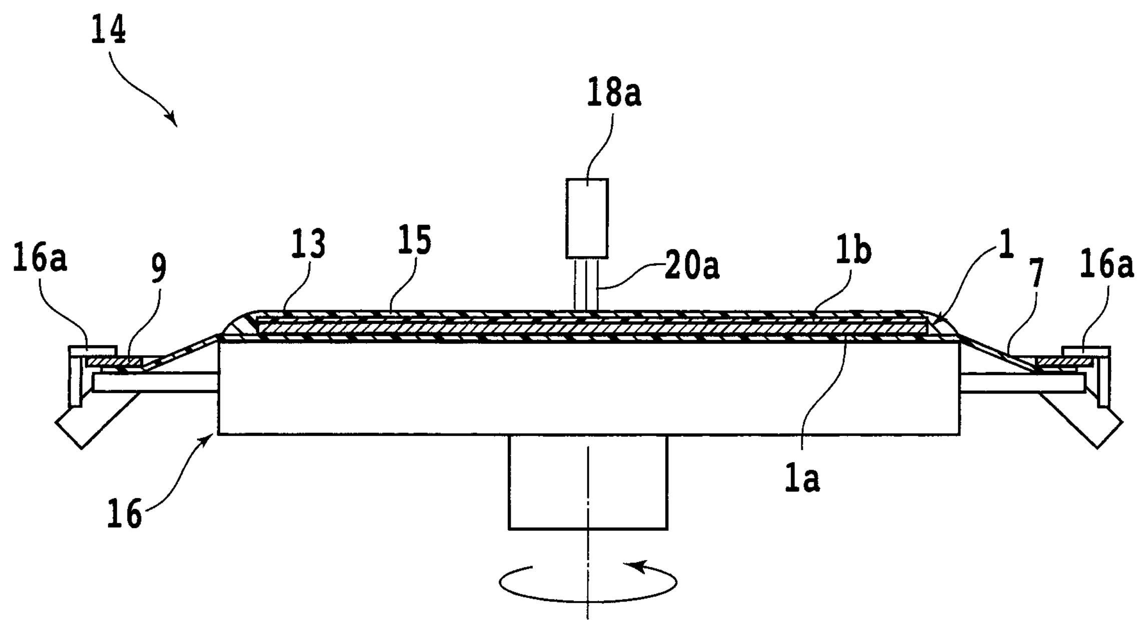
FIG. 4A is a cross-sectional view schematically illustrating a manner of a water-soluble resin providing step according to the preferred embodiment of the present invention.

In the manufacturing method of a device chip of the preferred embodiment, a water-soluble resin providing step S4 is then carried out in which a water-soluble resin in a liquid state is supplied to a front surface of the solidified die bonding resin 13 to cover the die bonding resin 13 with the water-soluble resin. FIG. 4A is a cross-sectional view schematically illustrating a manner of the water-soluble resin providing step S4. FIG. 4A schematically illustrates a cross-section of the wafer 1 to which a water-soluble resin is supplied. The water-soluble resin providing step S4 may be carried out with the coating apparatus 14 by which the die bonding resin providing step S3 has been carried out, subsequently after the die bonding resin providing step S3, for example. Alternatively, the water-soluble resin providing step S4 may be carried out by transferring the wafer 1 to another coating apparatus configured similarly to the coating apparatus 14. In a case in which the die bonding resin providing step S3 and the water-soluble resin providing step S4 are carried out in the same coating apparatus 14, for example, a discharging nozzle 18*a* different from the discharging nozzle 18 used for supplying the die bonding liquid resin 20 may be used.

Figure 4B:
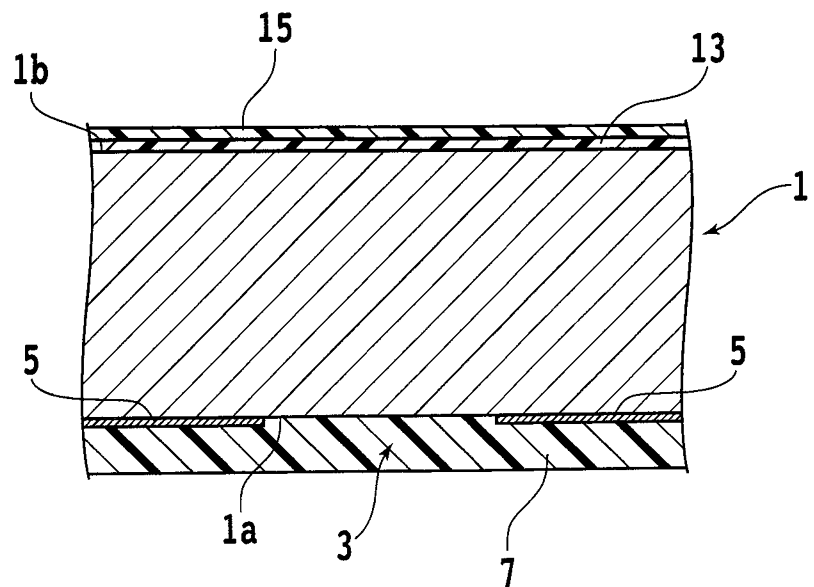
FIG. 4B is an enlarged cross-sectional view schematically illustrating the wafer on which a water-soluble resin is provided.

In the water-soluble resin providing step S4, as with the die bonding resin providing step S3, the holding table 16 holding the wafer 1 is rotated about the axis extending in the direction perpendicular to the upper surface of the holding table 16 at high speed. Then, a water-soluble resin 20*a* in a liquid state is dropped to the back surface 1*b* of the wafer 1 from the discharging nozzle 18*a* at a predetermined drop speed. Accordingly, a water-soluble resin 15 is provided on the back surface 1*b* of the wafer 1. FIG. 4B is an enlarged cross-sectional view schematically illustrating the wafer 1 after the water-soluble resin providing step S4 is carried out. As illustrated in FIG. 4B, when the water-soluble resin providing step S4 is carried out, the die bonding resin 13 on the back surface 1*b* of the wafer 1 is covered with the water-soluble resin 15, and accordingly, the die bonding resin 13 is protected by the water-soluble resin 15 in a subsequent etching step. Note that the water-soluble resin 15 can adopt a resin of one of the series of "HOGOMAX (registered trademark)" manufactured by DISCO Corporation, for example.

Figure 5A:
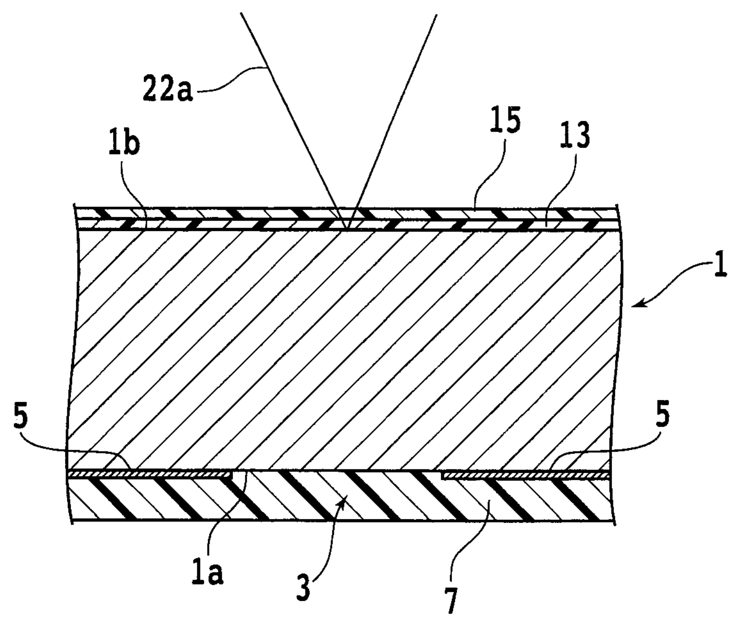
FIG. 5A is an enlarged cross-sectional view schematically illustrating the wafer in carrying out a laser processing step according to the preferred embodiment of the present invention.

After the water-soluble resin providing step S4 is carried out, a laser processing step S5 in which the die bonding resin 13 and the water-soluble resin 15 are removed along the division lines 3 and the back surface 1*b* of the wafer 1 is partially exposed along the division lines 3 is carried out. FIG. 5A is an enlarged cross-sectional view schematically illustrating the wafer 1 to be subjected to the laser processing step S5. The laser processing step S5 is carried out by a laser processing apparatus including a holding table holding the wafer 1, and a laser processing unit disposed above the holding table. The laser processing unit can emit a pulsed laser beam having an absorption wavelength to the wafer 1 (having a wavelength absorptive to the wafer 1) to focus a pulsed laser beam 22*a* on the back surface 1*b* of the wafer 1. The laser processing unit and the holding table are relatively movable in the horizontal direction.

Figure 5B:
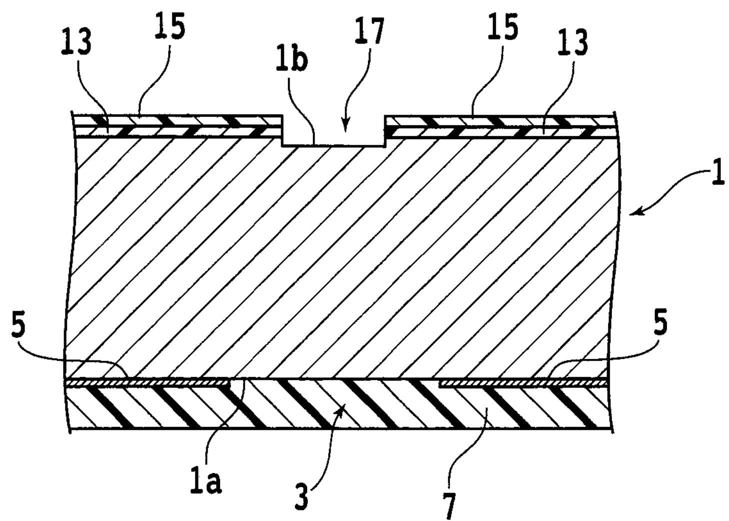
FIG. 5B is an enlarged cross-sectional view schematically illustrating the wafer formed with a processing groove in the laser processing step.

In the laser processing step S5, first, the wafer 1 is placed on the holding table of the laser processing apparatus. Then, the laser processing unit focuses the pulsed laser beam 22*a* on the back surface 1*b* of the wafer 1, and then, by causing the wafer 1 and the pulsed laser beam 22*a* to relatively move in the horizontal direction, the pulsed laser beam 22*a* is applied to the wafer 1 along a predetermined one of the division lines 3. When the pulsed laser beam 22*a* reaches the back surface 1*b* of the wafer 1, the pulsed laser beam 22*a* is absorbed in the wafer 1, and the wafer 1 is subjected to ablation processing. FIG. 5B is an enlarged cross-sectional view schematically illustrating the processed wafer 1. As illustrated in FIG. 5B, a processing groove 17 is formed along the predetermined one of the division lines 3 on the back surface 1*b* side of the wafer 1 by the pulsed laser beam 22*a*. At the same time, the die bonding resin 13 and the water-soluble resin 15 in a region overlapping with the processing groove 17 are removed. When the laser processing step S5 is carried out and a plurality of processing grooves 17 are formed along all of the division lines 3 on the back surface 1*b* side of the wafer 1, the back surface 1*b* of the wafer 1 is exposed on each bottom of the processing grooves 17. In an etching step to be carried out next, each exposed portion of the wafer 1 is etched.

When the wafer 1 is laser-processed, the wafer 1, the die bonding resin 13, and the water-soluble resin 15 which are removed in the laser processing step S5 are scattered on the back surface 1*b* of the wafer 1 and then adhered to the water-soluble resin 15. However, the water-soluble resin 15 is to be removed in the water-soluble resin removing step to be described later. Accordingly, the adhered substances adhered to the water-soluble resin 15 are removed with the water-soluble resin 15 and do not remain on each device chip to be formed. Thus, when the die bonding resin 13 is used to mount the device chip to a predetermined mounting object, a bonding defect due to the adhered substances does not occur.

Next, in the manufacturing method of a device chip according to the present invention, an etching step S6 is carried out. In the etching step S6, an etching gas in a plasma state is supplied to the back surface 1*b* of the wafer 1, the exposed portions on the back surface 1*b* of the wafer 1 are etched, and then the wafer 1 is divided into individual device chips. More specifically, in the etching step S6, the wafer 1 is etched at the bottom portion of each of the processing grooves 17 formed in the laser processing step S5 and then divided into individual device chips. The etching step S6 is carried out by a plasma etching apparatus including a processing chamber, not illustrated. Inside the processing chamber, a pair of upper and lower electrodes are connected to a high frequency power supply and disposed so as to face each other in the vertical direction. The lower electrode is stored inside the holding table holding the wafer 1, and the holding table has a cooling mechanism disposed therein, the cooling mechanism cooling the wafer 1.

When the etching step S6 is carried out, the wafer 1 is placed on the holding table inside the processing chamber of the plasma etching apparatus, and the processing chamber is evacuated to vacuum an air inside the processing chamber. Then, an etchant gas is introduced into the processing chamber, applying a high frequency voltage to the pair of upper and lower electrodes by the high frequency power supply. Then, the etchant gas is converted into plasma in the vicinity of the holding table, and the plasma etchant gas is applied to the exposed portion of the wafer 1, thereby etching the wafer 1. Note that, in a case in which the wafer 1 has a thickness larger than a width of each of the processing grooves 17 formed on the back surface 1*b* side of the wafer 1, during etching the wafer 1, a side wall surface of each processing groove 17 may be greatly damaged by etching. To prevent this possible damage on the wafer 1, after the etching of the wafer 1 proceeds to some extent, a protective film protecting the side wall surface formed in each processing groove 17 is formed, and thereafter, etching may be restarted. Then, etching of each bottom portion of the processing grooves 17 of the wafer 1 and protection of the side wall surface are repetitively carried out, and accordingly, the wafer 1 may be etched deeper toward the front surface 1*a* of the wafer 1.

Figure 5C:
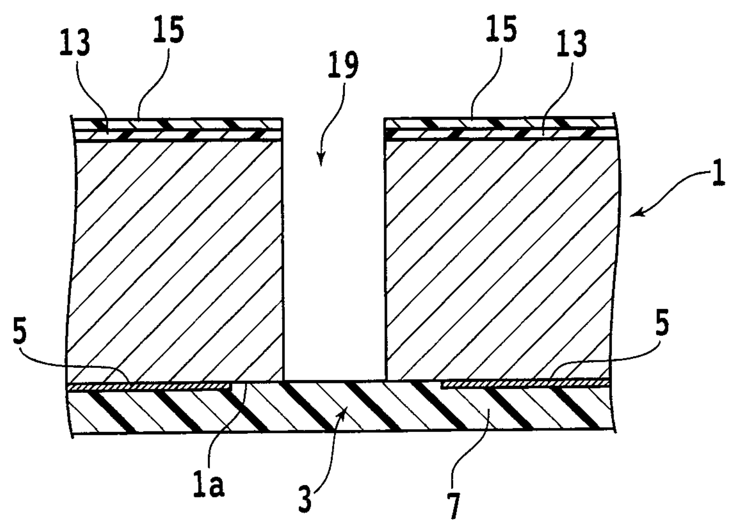

In this case, as the etchant gas, sulfur hexafluoride ($SF_6$) or the like is used, for example. Also, in a case in which the protective film is formed on the side wall surface of each processing groove 17 which is exposed as a result of etching, a gas such as $C_4F_8$ is applied to the side wall surface of each processing groove 17 to form the protective film thereon, for example. FIG. 5C is an enlarged cross-sectional view schematically illustrating the wafer 1 which has been subjected to the etching step S6. As illustrated in FIG. 5C, through the etching step S6, a plurality of processing grooves 19 each having a bottom portion which reaches the protective member 7 provided on the front surface 1*a* of the wafer 1 are formed along all of the division lines 3, so that the wafer 1 is divided into individual device chips. The individual device chips thus formed are supported by the frame 9 through the protective member 7 attached to the front surface 1*a* of the wafer 1. Note that, during carrying out the etching step S6, the die bonding resin 13 provided on the back surface 1*b* side of the wafer 1 is protected by the water-soluble resin 15, and accordingly, the die bonding resin 13 is not likely to generate degradation or other changes in quality. More specifically, since the die bonding resin 13 is protected by the water-soluble resin 15, the die bonding resin 13 does not lose the adhesive function as the DAF.

Figure 6:
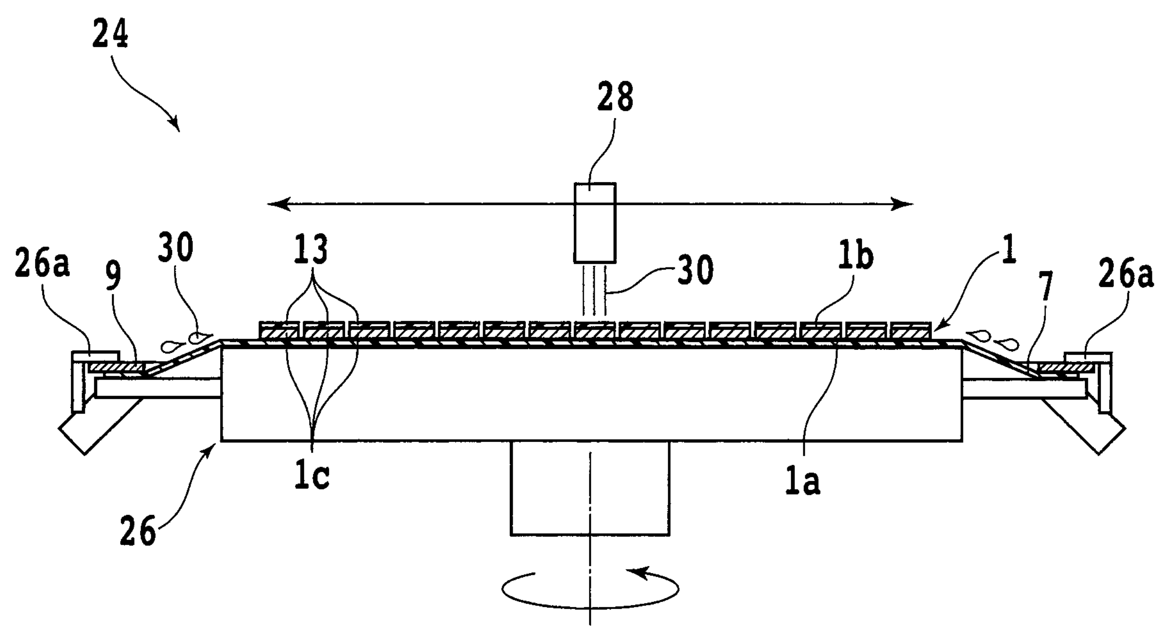
FIG. 6 is a cross-sectional view schematically illustrating a manner of a water-soluble resin removing step according to the preferred embodiment of the present invention.

In the manufacturing method of a device chip according to the preferred embodiment, next, a water-soluble resin removing step S7 in which water is supplied to the back surface 1*b* side of the wafer 1 to remove the water-soluble resin 15 and obtain each device chip with the die bonding resin 13 provided thereon is carried out. FIG. 6 is a cross-sectional view schematically illustrating a manner of the water-soluble resin removing step S7. The water-soluble resin removing step S7 is carried out by a cleaning apparatus 24 illustrated in FIG. 6, for example. The cleaning apparatus 24 includes a holding table 26 holding each of the device chips 1*c* formed from the wafer 1 through the protective member 7, and a discharging nozzle 28 discharging a cleaning liquid 30 to each of the device chips 1*c* held on the holding table 26. On an outer peripheral portion of an upper surface of the holding table 26, there are provided a plurality of clamps 26*a* gripping the frame 9 attached to the outer peripheral portion of the protective member 7. The discharging nozzle 28 has a discharging port, not illustrated, which faces downward, and is movable along a path passing through a position above a center of the upper surface of the holding table 26, discharging the cleaning liquid 30 from the discharging port. Note that the cleaning liquid 30 is pure water, for example. Alternatively, the cleaning liquid 30 may be a mixed fluid in which a high-pressurized air and pure water are mixed.

In the water-soluble resin removing step S7, first, each of the device chips 1*c* formed from the wafer 1 is placed on the holding table 26, and the frame 9 is gripped with the plurality of clamps 26*a*. Then, the holding table 26 is rotated about an axis extending a direction perpendicular to the upper surface of the holding table 26. Then, while the cleaning liquid 30 is sprayed onto the holding table 26 at a predetermined drop speed from the discharging nozzle 28, the discharging nozzle 28 is horizontally moved back and forth along the path passing through the position above the center of the upper surface of the holding table 26. When the cleaning liquid 30 is supplied to the back surface side of each of the device chips 1*c*, the water-soluble resin 15 is removed to thereby obtain the individual device chips 1*c* with the die bonding resin 13 provided thereon. The individual device chips 1*c* remaining on the protective member 7 are then picked up from the protective member 7 and then attached to a predetermined object through the die bonding resin 13. When each of the device chips 1*c* is picked up from the protective member 7, to facilitate a pick-up operation, a distance between adjacent ones of the device chips 1*c* may be increased by expanding the protective member 7 in an outer peripheral direction.

As described above, according to the manufacturing method of a device chip in the preferred embodiment, device chips 1*c* with the die bonding resin 13 provided on the back surface thereof can be manufactured. Since the wafer 1 is divided by plasma etching, a chipping, a crack, or other damages is not likely to be caused in the device chips 1*c*, whereby the bending strength of the device chips 1*c* is increased. In addition, since the water-soluble resin 15 is provided on the die bonding resin 13 before carrying out the plasma etching process, degradation of the die bonding resin 13 due to the plasma etching process is suppressed. Moreover, since the die bonding resin 13 and the water-soluble resin 15 function as a resist film necessary for plasma etching, there is no need to additionally form another resist film on the wafer 1. Since the water-soluble resin 15 is removed by the cleaning liquid 30 including water, there is no need to carry out an additional cleaning process, and it is possible to remove the adhered substances which are adhered onto the water-soluble resin 15 easily and reliably. Since the adhered substances are not left on the die bonding resin 13, a bonding defect is not likely to occur when mounting the device chips 1*c* with the die bonding resin 13 provided thereon on a predetermined mounting object.

Note that the present invention is not limited to the foregoing embodiment, and various modifications are applicable. For example, such a case that the wafer 1 is subjected to ablation processing by application of the pulsed laser beam 22*a* to thereby remove the die bonding resin 13 and the water-soluble resin 15 reliably has been described in the laser processing step S5 of the foregoing embodiment, but one aspect of the present invention is not limited thereto. For example, as an alternative, only the die bonding resin 13 and the water-soluble resin 15 may be removed, and a groove may not be formed on the back surface 1*b* side of the wafer 1. However, unless the die bonding resin 13 and the water-soluble resin 15 are removed completely, the subsequent plasma etching may not be properly carried out. Hence, it is preferred that the die bonding resin 13 and the water-soluble resin 15 be sufficiently removed.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A manufacturing method of a device chip, comprising:

a protective member providing step of providing a protective member on a front surface side of a wafer on which a plurality of devices are individually formed in separate respective regions defined by a plurality of division lines crossing each other on the front surface side of the wafer;

a die bonding resin providing step of supplying a die bonding resin in a liquid state to a back surface side of the wafer and solidifying the die bonding resin, after the protective member providing step is carried out;

a water-soluble resin providing step of supplying a water-soluble resin in a liquid state to a front surface of the die bonding resin solidified to cover the die bonding resin with the water-soluble resin, after the die bonding resin providing step is carried out;

a laser processing step of applying a laser beam having an absorption wavelength to the wafer from the back surface side of the wafer and removing the die bonding resin and the water-soluble resin along each of the division lines to thereby partially expose the back surface of the wafer along the each of the division lines, after the water-soluble resin providing step is carried out;

an etching step of supplying an etching gas in a plasma state to the back surface side of the wafer and etching an exposed portion of the wafer on the back surface side thereof while protecting the die bonding resin with the water-soluble resin to thereby divide the wafer into individual device chips, after the laser processing step is carried out; and a water-soluble resin removing step of supplying water to the back surface side of the wafer and removing the water-soluble resin to obtain device chips with the die bonding resin provided thereon, after the etching step is carried out.

2. The manufacturing method of a device chip according to claim 1, further comprising:

a grinding step of grinding the back surface of the wafer to thin the wafer to a predetermined thickness of each of the device chips, before the die bonding resin providing step is carried out.

* * * * *